(12) United States Patent
Okada et al.

(10) Patent No.: US 6,287,532 B1
(45) Date of Patent: Sep. 11, 2001

(54) HYDROTALCITE COMPOUNDS OF LOW URANIUM (U) CONTENT AND PROCESSES FOR THEIR PREPARATION

(75) Inventors: Akira Okada, Takamatsu; Satoko Yamashita, Nakatado-gun; Koji Shimizu, Sakaide, all of (JP)

(73) Assignee: Kyowa Chemical Industry Co Ltd, Kagawa-Ken (JP)

( * ) Notice: Subject to any disclaimer, the term of this patent is extended or adjusted under 35 U.S.C. 154(b) by 0 days.

(21) Appl. No.: 09/398,428

(22) Filed: Sep. 17, 1999

(30) Foreign Application Priority Data

Sep. 21, 1998 (JP) .................................................. 10-283557
Nov. 10, 1998 (JP) .................................................. 10-333357

(51) Int. Cl.$^7$ .................................................. G01B 31/30
(52) U.S. Cl. .......................................................... 423/420.2
(58) Field of Search ......................... 423/420.2; 106/419, 106/431, 463, 471

(56) References Cited

U.S. PATENT DOCUMENTS

| 4,458,026 | * | 7/1984 | Reichle ..................................... 502/80 |
| 4,683,253 | | 7/1987 | Miyake et al. ......................... 523/442 |

FOREIGN PATENT DOCUMENTS

| 0749996 | 12/1996 | (EP) . |
| 55080447 | 6/1980 | (JP) . |
| 01206656 | 8/1989 | (JP) . |
| 01245039 | 9/1989 | (JP) . |
| 04202555 | 7/1992 | (JP) . |
| 08337638 | 12/1996 | (JP) . |

* cited by examiner

*Primary Examiner*—Stuart L. Hendrickson

(57) ABSTRACT

Hydrotalcite compounds useful as additives to synthetic resins such as epoxy resins which are used as, in particular, sealant for semiconductor devices such as transister, IC, LSI and the like, which are characterized by having a composition represented by the formula (1) below:

$$M_{1-x}^{2+}Al_x^{3+}(OH)_2 A^{2-}_{x/2} \cdot mH_2O \qquad (1)$$

in which $M^{2+}$ is at least one of $Mg^{2+}$ and $Zn^{2+}$, x is a positive number in the range of $0.2 \leq x \leq 0.5$, $A^{2-}$ is at least one of $CO_3^{2-}$ and $SO_4^{2-}$, and m is a number in the range of 0–2, and having a uranium (U) content of not more than 10 ppb, an average secondary particle size of not more than about 3 μm and a BET specific surface area of not more than 30 m$^2$/g.

6 Claims, No Drawings

HYDROTALCITE COMPOUNDS OF LOW URANIUM (U) CONTENT AND PROCESSES FOR THEIR PREPARATION

This invention relates to hydrotalcite compounds of low uranium (U) content and processes for their preparation. More particularly, the invention concerns hydrotalcite compounds which are useful as ion scavenger or various stabilizers for epoxy resins used for sealing large-capacity, high-integration memory semiconductor devices, without impairing reliability of the devices against soft errors.

Hydrotalcites having concurrently the various properties required for an inorganic powder additive for resins, such as good dispersibility and processability and no deteriorating effect on the products' appearance were disclosed in Japanese Patent KOKAI No. 80447/80A. The hydrotalcites shown in this publication are actually used in many synthetic resins as heat-stabilizers of PVC, stabilizers for polyolefins and the like.

Whereas, semiconductor devices such as transistor, IC, LSI and the like need to be sealed, for protection and insulation from contact, contamination and moisture from outside. Presently, resin sealing methods are advantageous from the standpoints of productivity and economy, and are widely practiced. In particular, epoxy resins are used for sealing semiconductor devices because of their favorable electrical characteristics, moisture resistance and adherability. Hydrotalcite compounds are used as ion scavenger or the like in such epoxy resin sealing material for semiconductor devices to perform the roles and functions of prevention of corrosion and improvement in moisture resistance of wiring.

With the still larger capacities and higher integration given to recent semiconductor memories, occurrence of soft errors caused by alpha ray emitted upon decay in radioactive substances such as uranium, thorium, etc. which are contained in the sealing resin compositions begins to create problems. For example, the content of uranium and thorium is required not to exceed 1 ppb (ng/g) for 4M bit memories, and not to exceed 0.1 ppb (ng/g) for 4–16M bit memories, in order to secure reliability against soft errors. In consequence, hydrotalcite compounds, which are blended in the epoxy resin sealant in such a small (minor) amount as not more than a few percent to said resin, are also required to contain not more than micro-level of radioactive substances.

An object of the present invention is to provide hydrotalcite compounds which are useful as ion scavengers for epoxy resin compositions serving as sealant for memory semiconductor devices in which capacity increase and raise in integration level are highly advanced, and which possess high reliability against soft errors. This object can be fulfilled by provision of high purity hydrotalcite compounds whose radioactive substance content, i.e., that of uranium and thorium, is exceeding low. Thus, the theme of the present invention is to provide hydrotalcite compounds which possess the properties required for additives to resin and have extremely low uranium content, and processes for their preparation.

The hydrotalcite compounds of the present invention are characterized in that they have the composition expressed by the formula (1) below:

$$M_{1-x}^{2+}Al_x(OH)_2 A^{2-}_{x/2} \cdot mH_2O \qquad (1)$$

[in which
$M^{2+}$ is at least one of $Mg^{2+}$ and $Zn^{2+}$,
x is a positive number of $0.2 \leq x \leq 0.5$,
A is at least one of $CO_3^{2-}$ and $SO_4^{2-}$, and
m is a number of 0 to 2],
have a uranium (U) content not more than 10 ppb, an average secondary particle size not more than about 3 μm and a BET specific surface area of not more than 30 m²/g.

The hydrotalcite compounds of the present invention are preferably those that are surface-treated with at least one surface-treating agent selected from the group consisting of higher fatty acid, anionic surfactant, silane-containing coupling agent, titanate-containing coupling agent, aluminium-containing coupling agent and phosphoric acid ester of higher alcohol.

Of those, particularly the hydrotalcite compounds which are surface-treated with not more than 3% by weight thereof of a silane-containing coupling agent are preferred.

The hydrotalcite compounds of the present invention are conveniently used as additives and fillers for synthetic resin.

Of the hydrotalcite compounds of above formula (1) of the present invention, particularly those whose $A^{2-}$ is $CO_3^{2-}$ are preferred. Whereas, those in which a part of $CO_3^{2-}$ is replaced with the other anion, eg., those containing not more than ⅕ mol of Al (not more than 40 mol % of —$CO_3^{2-}$), in particular, not more than ¹⁄₁₀ mol of Al (not more than 20 mol % of —$CO_3^{2-}$), of $SO_4^{2-}$ are also preferred.

The hydrotalcite compounds of low uranium content according to the invention can be prepared through the steps of (1) coprecipitation reaction of aqueous solution of a water-soluble aluminium compound with aqueous solution of a water-soluble magnesium compound and/or a water-soluble zinc compound under alkaline condition, at a composition of the starting materials satisfying the molar ratio in the range defined by the formula (2) below:

$$0.15 \leq \frac{\text{at least one of } CO_3^{2-} \text{ and } SO_4^{2-}}{M^{2+} + Al^{3+}} \leq 1.25 \qquad (2)$$

[in which $M^{2+}$ stands for at least one of $Mg^{2+}$ and $Zn^{2+}$], at temperatures ranging 10–50° C. and under stirring [hereafter may be referred to as step (1)], and (2) hydrothermal reaction of the resultant coprecipitation reaction product in the form of the suspension as formed in the step (1) reaction, at temperatures in the range of 90–200° C. for at least 0.5 hour [hereafter may be referred to as step (2)], in which occasion (3) adjusting the reaction conditions so that pH of the reaction suspension after the hydrothermal reaction falls within the range of 7.0 to 13.5.

In the production process according to the invention, it is particularly preferred to carry out the coprecipitation reaction (1) of aqueous solution of a water-soluble aluminium compound with aqueous solution of a water-soluble magnesium compound and/or water-soluble zinc compound under alkaline condition at the composition of the starting materials satisfying the molar ratio in the range defined by the formula (2-a) below:

$$0.15 \leq \frac{CO_3^{2-}}{M^{2+} + Al^{3+}} \leq 1.25 \qquad (2\text{-a})$$

[in which $M^{2+}$ stands for at least one of $Mg^{2+}$ and $Zn^{2+}$], at temperatures ranging 10–50° C. and under agitation.

In the present invention, it is also preferred to carry out the hydrothermal reaction of the coprecipitation reaction product which is obtained in said step (1), leaving said product in the state of suspension in the mother liquor of the reaction, at temperatures of 90–200 C. for at least 0.5 hour, preferably for 0.5–24 hours, while so adjusting the reaction conditions that pH of the reaction suspension after the hydrothermal reaction falls within the range of 7.0–13.5 [the step (2)], and then (4) to suspend the hydrothermal reaction product which has been washed with water, in an aqueous solution of ammonium carbonate and/or alkali (hydrogen) carbonate and to stir the suspension at temperatures of 10–100° C. for 1–24 hours (an eluting treatment).

Preferred concentration of ammonium carbonate and/or an alkali carbonate or alkali hydrogencarbonate in the aqueous solution used in (4) above is from 0.1 to 3.0 mols/liter.

While the pH value of the suspension after the hydrothermal reaction of step (2) in the production process of the present invention is an important condition which controls the elimination ratio of uranium, basically it may be the one sufficient for $UO_2^{2+}$ ions to take a form of such complex ions as $UO_2(OH)_3$, $UO_2(CO_3)_2^{2-}$, $UO_2(CO_3)_3^{4-}$ and the like in the aqueous solution, i.e., 7.0 or higher. At exceedingly high pH region, surface charge of the hydrotalcite compounds reverses to negative level and electrically repulses with the complex anions of uranium to prevent latter's absorption or the like, which enables better uranium elimination and the intended uranium content level can be achieved without the elution step (4) using ammonium carbonate, alkali (hydrogen)carbonate, etc. According to the production process of the present invention inclusive of the elution treatment step (4), the suitable pH range for the suspension after the hydrothermal reaction is 7.0–13.5, preferably 9.0–13.0. The mechanism for uranium elimination is not yet clear, but we presume: during this hydrothermal reaction, the hydrotalcite compounds undergo crystal growth to have reduced BET specific surface area, whereby dispersibility of the particles is improved and not only powder properties favorable for resin additives are imparted, but also uranium ions which are a kind of impurities are expelled to outside the crystals due to the purifying action of the substance accompanying the procedure of crystal growth. Thus expelled uranium ions either stay in the solution or, if re-adsorbed, remain in the surface portion of the crystals, allowing easy elution thereof with aqueous carbonate solution or the like. We infer that the mother liquor of the reaction having a high pH and containing anions serviceable as ligand contributes to increase the capacity of the solution for retaining the expelled uranium ions as dissolved therein, through formation of their complex ions or the like.

The hydrothermal reaction can be conveniently carried out at temperatures in a range of 90–200° C., for 0.5–24 hours, preferably at 100–170° C. for 1–10 hours. When the temperature-time conditions are lower than the specified ranges, crystal growth of the hydrotalcite compounds becomes insufficient, which tends to lead to incomplete dispersibility of the compounds and aggravates uranium removing efficiency. Thus, such conditions are inconvenient for obtaining the product of the present invention. Again, adoption of temperatures and time higher and longer than the specified ranges does not lead to a notable increase in the uranium removing efficiency, while production costs futilely increase.

As the eluent to be used in the elution treatment, aqueous ammonium carbonate solution, aqueous sodium hydrogencarbonate solution, aqueous sodium carbonate solution, mixed aqueous solution of ammonium carbonate/sodium hydrogencarbonate, mixed aqueous solution of ammonium carbonate/sodium carbonate, etc. at concentrations ranging from 0.1 to 3.0 mols/liter are conveniently used, preferred concentration of those aqueous solutions being 0.5–2.5 mols/liter.

As the water-soluble compounds or salts of magnesium, zinc and aluminium which are to be used in the step (1) coprecipitation reaction in the above-described production process of hydrotalcite compounds of low uranium content of the present invention, magnesium compounds such as magnesium chloride, magnesium sulfate, magnesium nitrate, magnesium acetate, magnesium hydroxide, magnesium oxide, bitter, brine and the like; zinc compounds such as zinc chloride, zinc nitrate, zinc sulfate, zinc acetate and the like; and aluminium compounds such as aluminium chloride, aluminium sulfate, aluminium nitrate, sodium aluminate and the like can be named as examples. Also examples of the alkaline compounds to be used for adjusting pH of the suspension formed through the coprecipitation reaction and hydrothermal reaction to a value within the range of 7.0 to 13.5 (at room temperature) include sodium hydroxide, potassium hydroxide, sodium carbonate, potassium carbonate, aqueous ammonia and ammonia gas.

Examples of carbonates to be used in the step (4) elution treatment include ammonium carbonate, sodium carbonate, sodium hydrogencarbonate, potassium carbonate and potassium hydrogencarbonate. It is also permissible to use them in combinations such as ammonium carbonate/sodium carbonate, ammonium carbonate/sodium hydrogencarbonate or the like, at optional mixing ratios within the prescribed concentration range (0.1–3.0 mols/liter).

In the occasion of incorporating the hydrotalcite compounds of low uranium content of the present invention in synthetic resins, the compounds may be surface-treated with at least one surface-treating agent selected from the group consisting of higher fatty acids, anionic surfactants, silane-containing coupling agents, titanate-containing coupling agents, aluminium-containing coupling agents and phosphoric acid esters of higher alcohols, to be imparted with improved compatibility and processability. Examples of preferred surface-treating agents according to the invention include: higher fatty acids such as lauric acid, palmitic acid, stearic acid, arachidic acid, oleic acid, erucic acid, etc. and alkali metal salts of these higher fatty acids; anionic surfactants such as sulfate ester salts of higher alcohols like stearyl alcohol, oleyl alcohol, etc., amide bond sulfate ester salts, ether bond alkylallyl sulfonic acid salts, etc.; phosphoric acid esters such as acid or alkali metal salts or amine salts, which are mono- or di-esters between orthophosphoric acid and oleyl alcohol, stearyl alcohol or the like, or mixtures of these esters; silane-containing coupling agents such as vinylethoxysilane, γ-methacryloxypropyltrimethoxysilane, γ-glycidoxypropyltrimethoxy silane, vinyl-tris(2-methoxyethoxy)silane, γ-aminopropyltrimethoxysilane and N-phenyl-γ-amino-propyltrimethoxysilene; titanate-containing coupling agents such as isopropyl triisostearoyl titanate, isopropyl tris(dioctylpyrophosphate) titanate and isopropyl tridecylbenzenesulfonyl titanate; and aluminum-containing coupling agents such as acetalkoxyaluminum diisopropylate, etc.

As methods of the surface treatment, there are wet method and dry method. In the wet method, a surface-treating agent as named above in liquid or emulsion state is added to slurry of the hydrotalcite compound, and sufficiently mixed under stirring at a temperature of about 10°–100° C. In the dry method, powder of the hydrotalcite compound is put in a mixer such as a Henschel mixer, to which the surface-treating agent in liquid, emulsion or solid state is added and sufficiently mixed with or without heating. Preferably, the surface-treating agent is used in an amount of about 0.05–about 10% by weight of the hydrotalcite compound.

Examples of the synthetic resins in which the hydrotalicte compounds of low uranium content of the present invention are conveniently used include:

polyolefine resins such as ethylene homopolymers, ethylene/α-olefine copolymers; ethylene/vinyl acetate or ethyl acrylate or methyl methacrylate copolymers, propylene homopolymers, propylene/α-olefine copolymers, α-olefine homopolymers or copolymers; and their halogenated resins;

polyamide resins such as ethylene/propylene thermoplastic elastomers, nylon 6, 6.6, 1.1, 1.2, 4.6, 6.10, 6.12, etc.;

epoxy resins such as bisphenol A epoxy resins, novolac epoxy resins, alicyclic epoxy resins, glycidyl epoxy resins, biphenyl epoxy resins, naphthalene ring-containing epoxy resins, cyclopentadiene-containing epoxy reins; and polyester resins such as PET, PBT, etc., and polyurethane resins which are the reaction products of polyisocyanates like organic diisocyanates, polyols like diols and polyamines like diamines.

When hydrotalcite compounds are heated, release of water of crystallization starts to take place in the vicinity of about 180–230° C. When such problems as foaming, silver streaks or other inconveniences attributable to release of the crystallization water are expected in the application to synthetic resins whose processing (or treating such as crosslinking) temperatures are relatively high, eg., 200° C. or higher, the hydrotalcite compounds of the present invention can be heated in advance at temperatures of 200–350° C. for 0.5–24 hours to render them dehydrated type [referring to the formula (1), those in which m is approximately 0.05–0, i.e., close to 0]. Such dehydrated type hydrotalcite compounds have a relatively higher uranium content in comparison with the original compounds containing water of crystallization, but have approximately the same levels of chemical properties such as acid-neutralizing ability and ion-exchange ability and physical properties such as secondary particle size, specific surface area, etc., and exhibit unchanged performance when used in the same application.

Physically, these dehydrated type hydrotalcite compounds are such that the water of crystallization present between crystal layers is removed but anions remain between the layers as they are. Their powder X-ray diffraction (XRD) chart changes from that of the original compound containing water of crystallization. That is, because it has lost its inter-layer water of crystallization, the interlayer distance is shrunken and narrowed. In consequence, in the XRD chart, the diffraction lines of (001) plane shift to higher angle side (direction of less interlayer distance).

Hereinafter the invention is explained in further details, referring to working Examples and Comparative Examples. The quantitative analysis of uranium in hydrotalcite compounds was conducted through the steps of dissolving individual sample in hydrochloric acid and perchloric acid, diluting the solution with diluted nitric acid and measuring the uranium in the liquid by ICP mass spectrometry. Secondary particle size was measured by laser diffraction scattering method, as to each sample as added to water or an organic solvent and dispersed with ultrasonic wave treatment.

Specific surface areas were determined based on the amount of nitrogen gas adsorption; using BET process.

REFERENTIAL EXAMPLE

The results of analyzing uranium and thorium in DHT-4A (trade name), produced by Kyowa Chemical Industries, Co. Ltd., which is a commercially available synthetic hydrotalcite and is currently most widely used as an additive to synthetic reins, are shown below.

TABLE 1

|  | U (ng/g) | Th (ng/g) |
|---|---|---|
| DHT-4A | 210 | <5 | unit: ng/g (ppb)

From the above data, it can be understood that, for example, blending of 5% by weight of the commercial synthetic hydrotalcite results in a resin composition with a uranium content of about 10 ppb, and such 2-digits uranium content of currently sold products must be reduced. Furthermore, when hydrotalcite is synthesized using conventional starting materials, thorium is always less than the level of detection limit, and it is also understood that reduction in the uranium content is the hurdle to overcome to serve the present object.

Example 1

Bittern of Mg concentration 1.5 mols/liter [which contained 50 ng/g (ppb) of uranium as converted per $Mg(OH)_2$] 361 ml and an aqueous industrial grade aluminium sulfate solution of Al concentration 1.03 mols/liter [which contained 576 ng/g (ppb) of uranium as converted per $Al(OH)_3$] 117 ml were mixed. This mixed aqueous solution was placed in a 2 liter-beaker, and into which 3.4 N aqueous sodium hydroxide solution 585 ml and an aqueous solution of 0.8 mol/liter sodium carbonate 226 ml were poured under vigorous stirring at room temperature. The stirring was continued for about 30 minutes to provide a coprecipitation product.

The suspension of the coprecipitation product which was concentrated by sedimentation to a volume of 700 ml was transferred into a 0.98-liter autoclave and subjected to a hydrothermal reaction at 170° C. for 6 hours. After subsequent cooling, pH of the suspension was 13.17 (30.1° C.). The product was recovered by filtration, washed with water and dried at 95° C. for 18 hours, and the dry product was sieved with a 100-mesh sieve.

The product was identified to be a hydrotalcite compound by powdee X-ray diffraction measurement. Its uranium (as U) content was 8 ppb [ng/g (dry powder)], average secondary particle size was 1.0 μm and BET specific surface area was 11.2 m²/g.

The product's chemical formua as determined from the result of its chemical analysis was as follows:

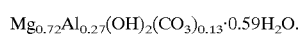

$Mg_{0.72}Al_{0.27}(OH)_2(CO_3)_{0.13} \cdot 0.59H_2O$.

Example 2-1

Using the same starting materials as those of Example 1, the operations of Example 1 were repeated, except that the amounts of 3.4 N aqueous sodium hydroxide solution and 0.8 mol/liter aqueous sodium carbonate solution were changed to 478 ml and 226 ml, respectively. The suspension after the hydrothermal reaction at 170° C. for 6 hours had a pH of 12.08 (28.6° C.).

The product was identified to be a hydrotalcite compound by powder X-ray diffraction measurement. Its uranium (as U) content was 17 ppb [ng/g (dry powder)], average secondary particle size was 0.59 μm and BET specific surface area was 13.4 m²/g.

The product's chemical formula as determined from the results of its chemical analysis was as follows:

$Mg_{0.70}Al_{0.30}(OH)_2(CO_3)_{0.15} \cdot 0.54H_2O.$

Example 2-2

Ammonium carbonate of first class grade 47 g was dissolved in deionized water and the total volume of the solution was adjusted to 700 ml, which was put in a 1-liter beaker. Under stirring, 27 g of the hydrotalcite compound which was obtained in Example 2-1 was added to the solution and stirred for 20 hours at room temperature. The product was recovered by filtration, washed with water and dried at 95° C. for 18 hours. The dry product was sieved with a 100-mesh sieve.

The product was identified to be a hydrotalcite compound by powder X-ray diffraction measurement. Its uranium (as U) content was not more than 5 ppb (ng/g), average secondary particle size was 0.59 μm and BET specific surface area was 13.0 m²/g. The product's chemical formula as determined from the result of its chemical analysis was as follows:

$Mg_{0.69}Al_{0.30}(OH)_2(CO_3)_{0.15} \cdot 0.54H_2O.$

Example 2-3

A 0.5 mol/liter aqueous industrial grade sodium carbonate solution 700 ml was placed in a 1-liter beaker, into which 27 g of the hydrotalcite compound obtained in Example 2-1 was added under stirring, followed by 20 hours' stirring at room temperature. The product was recovered by filtration, washed with water and dried at 95° C. for 18 hours. The dry product was sieved with a 100-mesh sieve. Said product was identified to be a hydrotalcite compound by powder X-ray diffraction measurement. Its uranium (as U) content was 5 ppb (ng/g), average secondary particle size was 0.59 μm and BET specific surface area was 13.3 m/g. The product's chemical formula as determined from the result of its chemical analysis was as follows:

$Mg_{0.70}Al_{0.30}(OH)_2(CO_3)_{0.15} \cdot 0.54H_2O.$

Example 3

Using the same starting materials as those of Example 1, the operations of Example 1 were repeated, except that the amounts of 3.4 N aqueous sodium hydroxide solution and 0.8 mol/liter aqueous sodium carbonate solution were changed to 461 ml and 226 ml, respectively. The suspension formed of the hydrothermal reaction had a pH of 11.05 (28.2° C.).

The cake obtained through filtration and washing with water was placed in 700 ml of 1.0 mol/liter aqueous solution of first class grade ammonium carbonate and suspended under stirring followed by 20 hours' stirring at room temperature. The cake obtained by filtration and washing with water was placed in a 2-liter beaker, into which 800 ml of deionized water was added to form a suspension under stirring and heated to 80° C. In a 200-ml beaker 1.2 g of sodium stearate (purity: 86%) and 150 ml of deionized water were placed and heated to about 80° C. to form a solution. The solution was poured into the suspension under stirring, and the system was maintained at 80° C. for 30 minutes. The reaction product was recovered by filtration, washed with water and dried at 95° C. for 18 hours, and then sieved with a 100-mesh sieve. The product was identified to be a hydrotalcite compound by powder X-ray diffraction measurement. The product's uranium (as U) content was not more than 5 ppb (ng/g), average secondary particle size was 0.59 μm and BET specific surface area was 13.0 m²/g. Its chemical formula determined from the result of chemical analysis was as follows:

$Mg_{0.69}Al_{0.31}(OH)_2(CO_3)_{0.15} \cdot 0.53H_2O.$

Example 4

A 1.2 mols/liter aqueous zinc chloride solution 300 ml was mixed with 225 ml of 0.4 mol/liter aqueous solution of industrial grade aluminum sulfate. The mixture was placed in a 2-liter beaker, into which 318 ml of industrial grade 3.4 N NaOH solution and 135 ml of industrial grade 0.8 mol/liter Na₂CO₃ solution were poured at room temperature under vigorous stirring, followed by about 30 minutes' agitation.

The total volume of the resultant suspension of coprecipitation product was reduced to 700 ml by sedimentation concentration. The suspension was transferred into a 0.98-liter autoclave, and subjected to a hydrothermal reaction at 110° C. for 15 hours.

The resultant suspension after cooling had a pH of 10.51 (29.2° C.). The cake recovered by filtration was washed with water and put in 700 ml of a 0.5 mol/liter aqueous solution of ammonium carbonate of first class grade, and uniformly suspended with a stirrer, followed by 20 hours' stirring at room temperature. Filtering the suspension, the cake recovered was washed with water and dried at 95° C. for 18 hours. The dry product was sieved with a 100-mesh sieve, which was identified to be a hydrotalcite compound by powder X-ray diffraction measurement and chemical analysis. Its uranium (U) content was not more than 5 ppb [ng/g (dry powder)], average secondary particle size was 1.2 μm and BET specific surface area was 9.9 m²/g.

The chemical formula of the product as determined by the chemical analysis was as follows:

$Zn_{0.67}Al_{0.33}(OH)_2(CO_3)_{0.17} \cdot 0.5H_2O.$

Example 5

In the same manner to Example 1, 363 ml of bittern having a Mg concentration of 1.5 mols/liter was mixed with 117 ml of the aqueous solution of industrial grade aluminium sulfate having an Al concentration of 1.03 mols/liter, and the mixture was put in a 2-liter beaker, to which 463 ml of 3.4 N sodium hydroxide solution and 303 ml of 0.8 mol/liter industrial Na₂CO₃ solution were poured at room temperature under vigorous stirring, followed by about 30 minutes' stirring.

From the resultant suspension of the coprecipitate, 600 ml was transferred into a 0.98-liter autoclave and subjected to a hydrothermal reaction at 170° C. for 6 hours. After subsequent cooling, pH of the suspension was 10.56 (25.0° C.). The product was recovered by filtration, washed with water and dried at 95° C. for 18 hours, and the dry product was sieved with a 100- mesh sieve.

The product was identified to be a hydrotalcite compound by powder X-ray diffraction measurement.

Its uranium content was 13 ppb, average secondary particle size was 0.60 μm and BET specific surface area was 14 m²/g.

The product's chemical formula as determined by chemical analysis was as follows:

$Mg_{0.69}Al_{0.31}(OH)_2(CO_3)_{0.15} \cdot 0.54H_2O.$

Thus obtained hydrotalcite compound was added to 700 ml of a 1.0 mol/liter aqueous first class grade ammonium carbonate solution under stirring and suspended, followed by 20 hours' stirring at room temperature. The product was recovered by filtration, washed with water and dried at 95° C. for 18 hours. The dry product was sieved with a 100-mesh sieve. The product was identified to be a hydrotalcite compound by powder X-ray diffraction measurement. Its uranium (as U) content was not more than 5 ppb (ng/g), average secondary particle size was 0.60 μm and BET specific surface area was 14 m²/g. The product's chemical formula as determined from the result of its chemical analysis was as follows:

$$Mg_{0.69}Al_{0.31}(OH)_2(CO_3)_{0.15} \cdot 0.54H_2O.$$

Comparative Example 1

From the suspension of the coprecipitate as obtained in Example 5, 600 ml was taken and filtered. The filter cake was washed with water and placed in a 1-liter beaker. The cake was suspended in deionized water and the total amount of the suspension was adjusted to 600 ml. The suspension was transferred into a 0.98-liter autoclave and subjected to a hydrothermal reaction at 170° C. for 15 hours. After the subsequent cooling, the suspension had a pH of 9.94 (24.1° C.). The product was recovered by filtration, washed with water and dried at 95° C. for 18 hours. The dry product was sieved with a 100- mesh sieve.

Said product was identified to be a hydrotalcite compound by powder X-ray diffraction measurement and chemical analysis.

Its uranium content was 190 ppb (ng/g), average secondary particle size was 0.6 μm, and BET specific surface area was 19 m²/g.

The product's chemical formula as determined by chemical analysis was as follows:

$$Mg_{0.69}Al_{0.31}(OH)_2(CO_3)_{0.15} \cdot 0.54H_2O.$$

Example 6

Using the same starting liquid materials as those in Example 1, the copreicipitation reaction was conducted by continuous reaction method. That is, a bittern having a Mg concentration of 1.5 mols/liter, aqueous aluminium sulfate solution of 1.03 mols/liter in concentration and 0.8 mol/liter aqueous sodium carbonate solution were poured at the flow rates of 12.1 ml/min., 3.92 ml/min. and 5.5 ml/min., respectively under stirring into an approximately 1-liter reaction vessel from which the reaction suspension could be continuously discharged. Simultaneously, 3.4 N aqueous sodium hydroxide solution was added into the system with a feeding pump which can control flow rate, at a flow rate so adjusted as to maintain the pH of the reaction suspension at 10±0.2. The coprecipitation reaction was continued for 3 hours.

The resultant reaction suspension was condensed by sedimentation to a concentration of about 1.5 times, from which 700 ml was transferred into a 0.98-liter autoclave and subjected to a hydrothermal reaction at 170° C. for 6 hours, followed by cooling, filtration and washing with water. In a 1-liter beaker, 101 g of ammonium carbonate was dissolved in deionized water and the volume of the solution was adjusted to 700 ml, into which the above-obtained cake after the water washing was added under stirring and suspended, followed by 20 hours' stirring at room temperature. Then the suspension was filtered and the recovered cake was washed with water, transferred into a 2-liter beaker and suspended in 1 liter of deionized water under stirring. To the suspension 3 g of γ-glycidoxypropyltrimethoxysilane (A-187, Nippon Unicar) was poured under stirring, followed by 30 minutes' stirring. The resultant suspension was led to a spray dryer and dried, to provide a white dry powder. Thus obtained hydrotalcite compound had a uranium (U) content of not more than 5 ppb (ng/g), an average secondary particle size of 0.62 μm and a BET specific surface area of 13 m²/g.

The product's chemical formula determined through chemical analysis was as follows:

$$Mg_{0.69}Al_{0.31}(OH)_2(CO_3)_{0.15} \cdot 0.53H_2O.$$

Comparative Example 2

From the reaction suspension as obtained in the continuous coprecipitation reaction of Example 6, 700 ml was taken, filtered and washed with water. Thus recovered cake of the coprecipitation product was suspended in deionized water, and the volume of the suspension was adjusted to 700 ml. The suspension was transferred into a 0.98-liter autoclave and subjected to a hydrothermal reaction at 170° C. for 20 hours, followed by cooling, filtration, washing with water and drying at 950° C. for 18 hours. After the drying, the product was sieved with a 100-mesh sieve. The product was identified to be a hydrotalcite compound by powder X-ray diffraction measurement and chemical analysis. Its uranium (U) content was 200 ppb (ng/g), average secondary particle size was 0.5 μm and BET specific surface area was 13.5 m²/g.

The chemical formula of the product as determined by the chemical analysis was as follows:

$$Mg_{0.69}Al_{0.31}(OH)_2(CO_3)_{0.15} \cdot 0.54H_2O.$$

Ammonium carbonate of the first class grade 101 g was dissolved in deionized water, the volume of the solution was adjusted to 700 ml, and it was put in a 1-liter beaker. Under stirring with an agitator, 38 g of the hydrotalcite compound as obtained in Comparative Example 1 was added to the solution, followed by 20 hours' stirring at room temperature. The resulting suspension was filtered, and the recovered cake was washed with water and dried at 95° C. for 18 hours. The dry product was sieved with a 100-mesh sieve.

The product was identified to be a hydrotalcite compound by powder X-ray diffraction measurement and chemical analysis. Its uranium (U) content was 110 ppb (ng/g), average secondary particle size was 0.54 μm and BET specific surface area was 13 m²/g.

The product's chemical formula as determined by chemical analysis was as follows:

$$Mg_{0.69}Al_{0.31}(OH)_2(CO_3)_{0.15} \cdot 0.54H_2O.$$

Example 7

A mixture was formed by blending 133 ml of the same bittern having a Mg concentration of 1.5 mols/liter as used in Example 1, 143 ml of 0.2 mol/liter aqueous zinc sulfate solution and 143 ml of 0.4 mol/liter aqueous industrial grade aluminium sulfate solution, which was put in a 1-liter beaker. Under vigorous stirring, 202 ml of industrial 3.4N NaOH solution and 143 ml of industrial 0.8 mol/liter Na₂CO₃ solution were poured into said beaker, followed by about 30 minutes' stirring. The suspension of the formed coprecipitate, whose total volume was reduced to 700 ml by sedimentation concentration, was transferred into a 0.98-liter autoclave and subjected to a hydrothermal reaction at 150° C. for 10 hours. The resulting suspension after cooling had a pH of 9.71 (32.4° C.). Filtering the suspension, the filter cake was washed with water and put into 700 ml of 0.6 mol/liter aqueous solution of first class grade sodium hydrogencarbonate and uniformly suspended with a stirrer, followed by heating to 50° C. and standing for 2 hours. The suspension was subsequently filtered, and the filter cake was washed with water and dried at 95° C. for 18 hours. The dry product was sieved with a 100-mesh sieve.

The product was identified to be a hydrotalcite compound by powder X-ray diffraction measurement and chemical analysis.

The uranium (U) content of the product was 5 ppb [ng/g (dry powder)], the average secondary particle size was 0.6 μm, and BET specific surface area was 8.0 m²/g.

The chemical formula of the product as determined by the chemical analysis was as follows:

$$Mg_{0.58}Zn_{0.08}Al_{0.33}(OH)_2(CO_3)_{0.16} \cdot 0.5H_2O.$$

Example 8

A mixture was formed by blending 213 ml of the same bittern having a Mg concentration of 1.5 mols/liter as used in Example 1, 266 ml of 0.2 mol/liter aqueous industrial grade aluminium sulfate solution and 15 g of first class grade $Na_2SO_4$, which was put in a 1-liter beaker. Under vigorous stirring 251 ml of industrial 3.4N NaOH solution was poured into the mixture at room temperature, followed by about 30 minutes' stirring. The resultant suspension of the coprecipitate was transferred into a 0.98-liter autoclave and subjected to a hydrothermal reaction at 170° C. for 12 hours. The resultant suspension after cooling had a pH of 11.08 (29° C.).

The suspension was filtered, and the filter cake was washed with water, put in 700 ml of industrial 0.5 mol/liter aqueous $Na_2CO_3$ solution and uniformly suspended with a stirrer, followed by 10 hours' stirring at room temperature. Thereafter the suspension was filtered, and the filter cake was washed with water and dried at 95° C. for 18 hours.

The dry product was sieved with a 100-mesh sieve.

The product was identified to be a hydrotalcite compound by powder X-ray diffraction analysis and chemical analysis.

The product had a uranium (U) content of 8 ppb [ng/g (dry powder)], an average secondary particle size of 1.5 μm and a BET specific surface area of 10.9 m²/g.

The product's chemical formula determined by the chemical analysis was as follows:

$$Mg_{0.75}Al_{0.25}(OH)_2(CO_3)_{0.113}(SO_4)_{0.012} \cdot 0.6H_2O.$$

Example 9

The dry powder of the hydrotalcite compound after the aqueous ammonium carbonate treatment as obtained in Example 5 was given a drying treatment in a laboratory gear oven at 270° C. for 8 hours, and whereby converted to dehydrated type hydrotalcite compound, which had a uranium (U) content of 6 ppb [ng/g], an average secondary particle size of 0.6 μm and a BET specific surface area of 15 m²/g. The weight decrease caused by heating at 250° C. for an hour was by 0.5%.

Example 10

The cake obtained through the steps of coprecipitation reaction, hydrothermal reaction, the treatment with aqueous ammonium carbonate solution, filtration and washing with water as in Example 6 was suspended in deionized water. The suspension was heated to 80° C., and into which 5% by weight sodium stearate solution of a prescribed amount was poured under stirring, followed by 30 minutes' stirring. Subsequently the suspension was filtered, and the filter cake was washed with water and dried at 95° C. for 18 hours. The dry product was pulverized to provide a surface-treated dry powder, which was further dried in a hot-air dryer at 230° C. for 20 hours. The resultant dehydrated type hydrotalcite compound had a uranium (U) content of 8 ppb [ng/g], an average secondary particle size of 0.65 μm and a BET specific surface area of 14 m²/g. The weight decrease caused by an hour's heating at 250° C. was by 0.8%.

The diffraction sites on (003) plane [2θ value] and spacing [d(003) value] as determined by XRD measurement of the dehydrated type hydrotalcite compounds obtained in Examples 9 and 10 are shown below.

TABLE 2

|  | Dehydrated type | Original crystallization of water-containing type |
|---|---|---|
| Example 9 |  | (dry product of Example 5) |
| 2θ [deg.] | 13.30 | 11.60 |
| d(003) [Å] | 6.65 | 7.62 |
| Example 10 |  | (dry product of Example 6) |
| 2θ [deg.] | 13.10 | 11.60 |
| d(003) [Å] | 6.75 | 7.62 |

(XRD measurement by CuKα rays)

As explained in the foregoing, according to the present invention high purity (uranium content not more than 10 ppb) hydrotalcite compounds can be produced easily and industrially. Thus, hydrotalcite compounds suitable as additives to high integration level semiconductor memory element-sealing resin compositions can be provided.

What is claimed is:

1. A process for producing a hydrotalcite compound derived from a water-soluble magnesium compound and a water-soluble aluminium compound which contain(s) at least 50 ng/g (ppb) of a uranium compound as calculated in terms of uranium (U) based on $Mg(OH)_2$ and/or $Al(OH)_3$, said hydrotalcite compounds being represented by the formula (1) below:

$$Mg_{1-x}^{2+}Al_x^{3+}(OH)_2A_{x/2}^{2-} \cdot mH_2O \qquad (1)$$

in which x is a positive number in the range of $0.2 \leq x \leq 0.5$, $A^{2-}$ is at least one of $CO_3^{2-}$ and $SO_4^{2-}$, and m is a number in the range of 0–2, having an average secondary particle size of not more than 3 μm and a BET specific surface area of not more than 30 m²/g and wherein they have a uranium (U) content of not more than 10 ppb, which comprises (1) subjecting an aqueous solution of the water-soluble aluminium compound and the water-soluble magnesium compound, which as a whole contain a uranium compound in an amount corresponding to at least 50 ng of uranium (U) as calculated per gram of $Mg(OH)_2$ and/or $Al(OH)_3$, to a coprecipitation reaction under alkaline conditions, the composition of the starting materials satisfying the molar ratio within the range defined by the formula (2) below:

$$0.15 \leq \frac{\text{at least one of } CO_3^{2-} \text{ and } SO_4^{2-}}{Mg^{2+} + Al^{3+}} \leq 1.25, \quad (2)$$

at temperatures of 10–50° C. under stirring, and (2) subjecting the resulting coprecipitation product, without isolating it from the suspension which served as the mother liquor of the coprecipitation reaction, to a hydrothermal reaction at a temperature of 90–200° C. for at least 0.5 hour, while keeping the pH of the reaction suspension within the range of 7.0–13.5.

2. A process for producing the hydrotalcite compounds according to claim 1, wherein in (1) the starting materials satisfy the molar ratio within the range defined by the formula [(2-a)] below:

$$0.15 \leq \frac{CO_3^{2-}}{Mg^{2+} + Al^{3+}} \leq 1.25 \quad (2\text{-a})$$

[in which $M^{2+}$ stands for at least one of $Mg^{2+}$ and $Zn^{2+}$,] at temperatures of 10–50° C. under stirring.

3. A process for producing the hydrotalcite compounds according to claim 1, which comprises, after carrying out the hydrothermal reaction of the above step (2), (3) suspending the hydrothermal reaction product, which has been washed with water, in an aqueous solution of ammonium carbonate and/or alkali carbonate, or ammonium carbonated and/or alkali hydrogen carbonate for a time from 1 to 24 hours under stirring at a temperature of 10–100° C.

4. A process for producing the hydrotalcite compounds according to claim 1, which are free from water of crystallization, which comprises heating the hydrotalcite compounds at temperatures of 200–350° C. for 0.5–24 hours.

5. A process for producing hydrotalcite compounds that are represented by the formula 1:

$$M^{2+}_{1-x} Al^{3+}_x (OH)_2 A^{2-}_{x/2} \cdot mH_2O \quad (1)$$

in which $M^{2+}$ is at least one of $Mg^{2+}$ and $Zn^{2+}$, x is a positive number in the range of $0.2 \leq x \leq 0.5$, $A^{2-}$ is at least one of $CO_3^{2-}$ and $SO_4^{2-}$, and m is a number in the range of 0–2, and have a uranium (U) content of not more than 10 ppb, an average secondary particle size of not more than about 3 μm and a BET specific surface area of not more than 30 m²/g, which comprises (1) subjecting an aqueous solution of water-soluble aluminium compound and an aqueous solution of water-soluble magnesium compound and/or water-soluble zinc compound to a coprecipitation reaction under alkaline conditions, the composition of the starting materials satisfying the molar ratio within the range defined by the formula (2) below:

$$0.15 \leq \frac{\text{at least one of } CO_3^{2-} \text{ and } SO_4^{2-}}{M^{2+} + Al^{3+}} \leq 1.25 \quad (2)$$

in which $M^{2+}$ stands for at least one of $Mg^{2+}$ and $Zn^{2+}$, at temperatures of 10–50° C. under stirring, and (2) subjecting the resulting coprecipitation product, without isolating it from the suspension which served as the mother liquor of the coprecipitation reaction, to a hydrothermal reaction at temperatures of 90–200° C. for at least 0.5 hour, (3) adjusting the reaction conditions in that occasion that the pH of the reaction suspension which has undergone the hydrothermal reaction should fall within the range of 7.0–13.5, and after carrying out the hydrothermal reaction, (4) suspending the hydrothermal reaction product, which has been washed with water, in an aqueous solution of ammonium carbonate and/or alkali carbonate or ammonium carbonate and/or alkali hydrogen carbonate, followed by 1–24 hours stirring at temperatures of 10–100° C.

6. The process for producing hydrotalcite compounds according to claim 5 wherein in step (1) the starting materials satisfy the molar ratio within the range defined by the formula (2-a) below:

$$0.15 \leq \frac{CO_3^{2-}}{M^{2+} + Al^{3+}} \leq 1.25, \quad (2\text{-a})$$

in which $M^{2+}$ stands for at least one of $Mg^{2+}$ and $Zn^{2+}$, at temperatures of 10–50° C. under stirring.

\* \* \* \* \*